United States Patent [19]

Takahashi

[11] Patent Number: 4,630,034
[45] Date of Patent: Dec. 16, 1986

[54] SAMPLING FREQUENCY CONVERTING APPARATUS

[75] Inventor: Hiroshi Takahashi, Tokyo, Japan

[73] Assignee: Nippon Electric Co., Ltd., Tokyo, Japan

[21] Appl. No.: 444,915

[22] Filed: Nov. 29, 1982

[30] Foreign Application Priority Data

Nov. 27, 1981 [JP]  Japan ................................ 56-190312

[51] Int. Cl.$^4$ .......................................... H03K 13/24
[52] U.S. Cl. .............................. 340/347 DD; 358/119
[58] Field of Search ................... 340/347 DD; 381/31; 179/2 DP, 1.5 FS

[56] References Cited

U.S. PATENT DOCUMENTS

| | | | |
|---|---|---|---|
| 4,270,026 | 5/1981 | Shenoi et al. ........................... | 381/31 |
| 4,270,027 | 5/1981 | Agrawal et al. .............. | 179/2 DP X |
| 4,460,890 | 7/1984 | Busby ........................... | 340/347 DD |

OTHER PUBLICATIONS

The Engineering Staff of Analog Devices, Inc., Analog–Digital Conversion Handbook, 6/1972, pp. I-84 to I-87.

*Primary Examiner*—T. J. Sloyan
*Attorney, Agent, or Firm*—Sughrue, Mion, Zinn, Macpeak, and Seas

[57] ABSTRACT

A sampling frequency converting apparatus converts an input digital television signal which is sampled at a first frequency into an output digital signal which is sampled at a second frequency. The apparatus comprises a memory, a write-address producer which operates in response to the first frequency, a read-address producer which operates in response to the second frequency, and an interpolation circuit. The speed of the converting operation is determined by the difference between the first and second frequencies.

3 Claims, 7 Drawing Figures

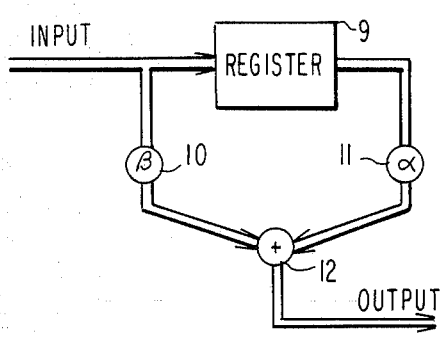
FIG. 3
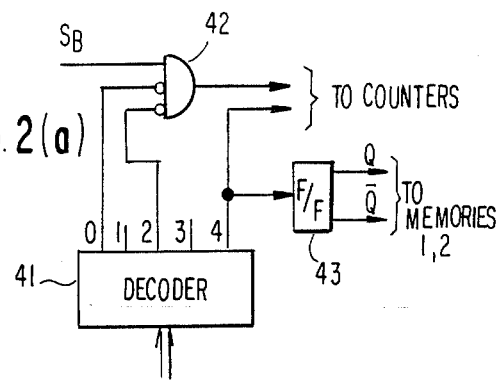
FIG. 2(a)
FIG. 5
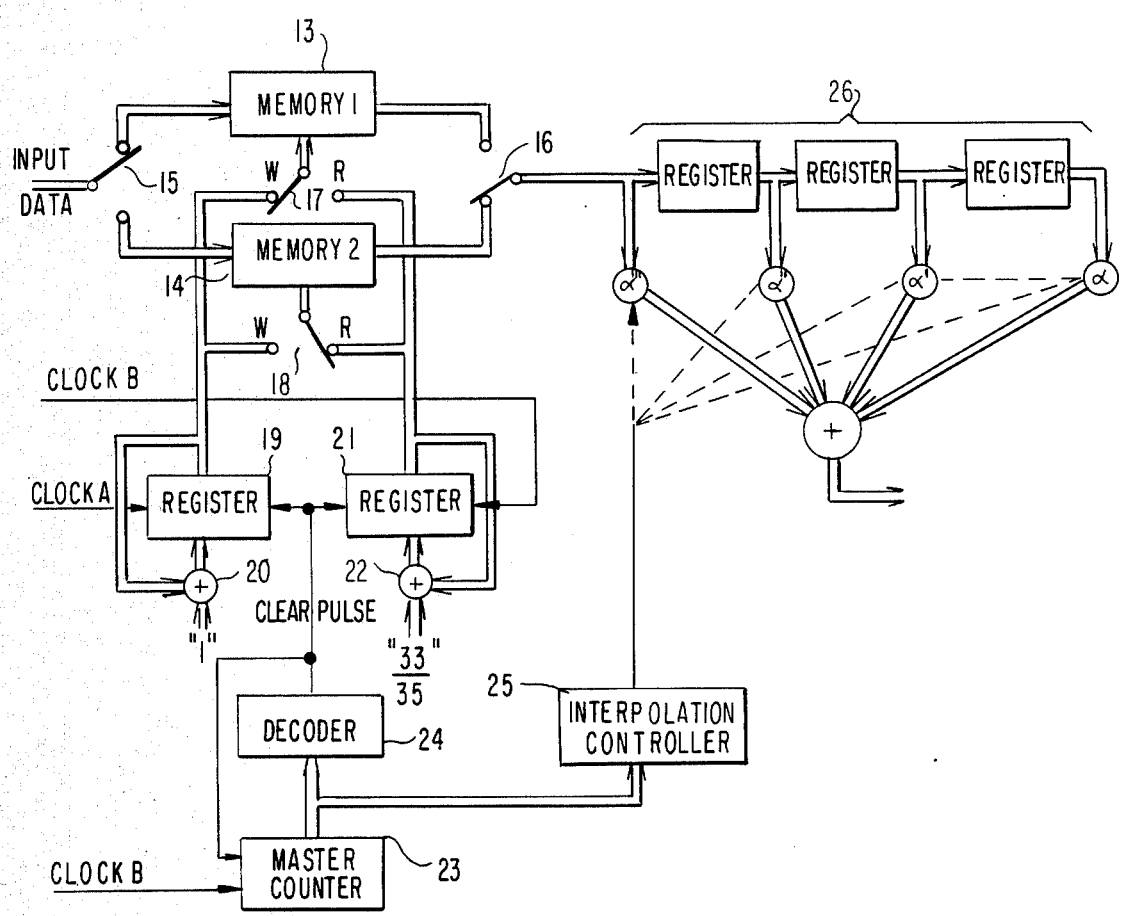

FIG. 4

| | 13.5—14.31818 $\alpha:\beta$ | 14.31818—13.5 $\alpha:\beta$ | | 13.5—14.31818 $\alpha:\beta$ | 14.31818—13.5 $\alpha:\beta$ | | 13.5—14.31818 $\alpha:\beta$ | 14.31818—13.5 $\alpha:\beta$ |
|---|---|---|---|---|---|---|---|---|
| $k_0$ | 1 : 0 | 1 : 0 | $k_{14}$ | $\frac{28}{35}:\frac{7}{35}$ | $\frac{5}{33}:\frac{28}{33}$ | $k_{28}$ | $\frac{21}{35}:\frac{14}{35}$ | $\frac{10}{33}:\frac{23}{33}$ |
| $k_1$ | $\frac{2}{35}:\frac{33}{35}$ | $\frac{31}{33}:\frac{2}{33}$ | $k_{15}$ | $\frac{30}{35}:\frac{5}{35}$ | $\frac{3}{33}:\frac{30}{33}$ | $k_{29}$ | $\frac{23}{35}:\frac{12}{35}$ | $\frac{8}{33}:\frac{25}{33}$ |
| $k_2$ | $\frac{4}{35}:\frac{31}{35}$ | $\frac{29}{33}:\frac{4}{33}$ | $k_{16}$ | $\frac{32}{35}:\frac{3}{35}$ | $\frac{1}{33}:\frac{32}{33}$ | $k_{30}$ | $\frac{25}{35}:\frac{10}{35}$ | $\frac{6}{33}:\frac{27}{33}$ |
| $k_3$ | $\frac{6}{35}:\frac{29}{35}$ | $\frac{27}{33}:\frac{6}{33}$ | $k_{17}$ | $\frac{34}{35}:\frac{1}{35}$ | $\frac{32}{33}:\frac{1}{33}$ | $k_{31}$ | $\frac{27}{35}:\frac{8}{35}$ | $\frac{4}{33}:\frac{29}{33}$ |
| $k_4$ | $\frac{8}{35}:\frac{27}{35}$ | $\frac{25}{33}:\frac{8}{33}$ | $k_{18}$ | $\frac{1}{35}:\frac{34}{35}$ | $\frac{30}{33}:\frac{3}{33}$ | $k_{32}$ | $\frac{29}{35}:\frac{6}{35}$ | $\frac{2}{33}:\frac{31}{33}$ |
| $k_5$ | $\frac{10}{35}:\frac{25}{35}$ | $\frac{23}{33}:\frac{10}{33}$ | $k_{19}$ | $\frac{3}{35}:\frac{32}{35}$ | $\frac{28}{33}:\frac{5}{33}$ | $k_{33}$ | $\frac{31}{35}:\frac{4}{35}$ | |
| $k_6$ | $\frac{12}{35}:\frac{23}{35}$ | $\frac{21}{33}:\frac{12}{33}$ | $k_{20}$ | $\frac{5}{35}:\frac{30}{35}$ | $\frac{26}{33}:\frac{7}{33}$ | $k_{34}$ | $\frac{33}{35}:\frac{2}{35}$ | |
| $k_7$ | $\frac{14}{35}:\frac{21}{35}$ | $\frac{19}{33}:\frac{14}{33}$ | $k_{21}$ | $\frac{7}{35}:\frac{28}{35}$ | $\frac{24}{33}:\frac{9}{33}$ | | | |
| $k_8$ | $\frac{16}{35}:\frac{19}{35}$ | $\frac{17}{33}:\frac{16}{33}$ | $k_{22}$ | $\frac{9}{35}:\frac{26}{35}$ | $\frac{22}{33}:\frac{11}{33}$ | | | |
| $k_9$ | $\frac{18}{35}:\frac{17}{35}$ | $\frac{15}{33}:\frac{18}{33}$ | $k_{23}$ | $\frac{11}{35}:\frac{24}{35}$ | $\frac{20}{33}:\frac{13}{33}$ | | | |
| $k_{10}$ | $\frac{20}{35}:\frac{15}{35}$ | $\frac{13}{33}:\frac{20}{33}$ | $k_{24}$ | $\frac{13}{35}:\frac{22}{35}$ | $\frac{18}{33}:\frac{15}{33}$ | | | |
| $k_{11}$ | $\frac{22}{35}:\frac{13}{35}$ | $\frac{11}{33}:\frac{22}{33}$ | $k_{25}$ | $\frac{15}{35}:\frac{20}{35}$ | $\frac{16}{33}:\frac{17}{33}$ | | | |
| $k_{12}$ | $\frac{24}{35}:\frac{11}{35}$ | $\frac{9}{33}:\frac{24}{33}$ | $k_{26}$ | $\frac{17}{35}:\frac{18}{35}$ | $\frac{14}{33}:\frac{19}{33}$ | | | |
| $k_{13}$ | $\frac{26}{35}:\frac{9}{35}$ | $\frac{7}{33}:\frac{26}{33}$ | $k_{27}$ | $\frac{19}{35}:\frac{16}{35}$ | $\frac{12}{33}:\frac{21}{33}$ | | | |

SAMPLING FREQUENCY CONVERTING APPARATUS

BACKGROUND OF THE INVENTION

This invention relates to a sampling frequency converting apparatus for a digital television signal.

When a television signal is converted into a digital television signal, different sampling frequencies are often used in different television systems such as NTSC, PAL and SECAM systems, or in the same television system. If a plurality of digital units adopting respective different sampling frequencies are applied in a digital television signal transmission path, a sampling frequency converting apparatus is ncessary to convert a digital signal with one sampling frequency $f_A$ into a digital signal with another frequency $f_B$. To perform such sampling frequency conversion in a purely digital manner, a frequency conversion method by means of a frequency of an integer multiplication of the sampling frequencies $f_A$ and $f_B$ has been proposed in the article "Sampling Rate Conversion for NTSC T.V." by B. G. Haskell, IEEE Communication Society, Mar. 3, 1977. However, this prior art method requires a high speed logic circuit (in comparison with the original sampling frequencies) and different circuit constructions for the conversions ($f_A \to f_B$) and ($f_B \to f_A$). Hence, this method is not advantageous in view of the complex circuit construction, the increased power consumption and the increased cost of production of the logic circuit.

SUMMARY OF THE INVENTION

It is therefore an object of the present invention to provide a sampling frequency converting apparatus which does not require a high calculation speed in order to convert between a first and a second of two sampling frequencies.

In accordance with the present invention, there is provided a sampling frequency converting apparatus which comprises means for temporarily storing a digital television signal (which is sampled by a first frequency) into a memory at the timing of the first frequency, means for reading out the digital television signal from the memory at the timing of a second frequency, and means for interpolating the read-out digital television signal from the memory so as to produce a digital television signal which is sampled by the second frequency. In the present invention, the maximum speed for the sampling frequency conversion is determined by the greater of the first and second sampling frequencies. Furthermore, the same circuit configuration can be used for the conversion from the first sampling frequency to the second sampling frequency and vice versa. The present invention presents further advantages in its relatively simple construction and lower power consumption.

BRIEF DESCRIPTION OF THE DRAWINGS

FIG. 2(a) shows the block diagram of the memory controller shown in FIG. 2;

FIG. 3 shows the basic construction of the interpolation filter of the invention;

FIG. 4 shows a table of an example of the coefficients of the interpolation filter shown in FIG. 4; and FIG. 5 shows a second embodiment of the present invention.

DESCRIPTION OF THE PREFERRED EMBODIMENTS

In a following description, it is initially assumed that an input digital television signal which is sampled by a sampling frequency $f_A$ (cycle period $T_A$) is converted into an output digital television signal which is sampled by a sampling frequency $f_B$ (cycle period $T_B$), and that the relationship between the sampling frequency $f_A$ and the sampling frequency $f_B$ can be defined as $f_A:f_B=M:N$ (where $T_A:T_B=M:N$, N and M being integers).

Figure 1A:
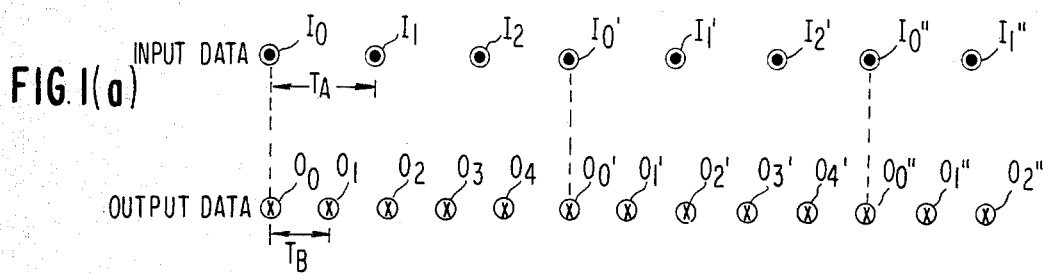
FIG. 1(a) is an explanatory diagram for explaining the principle of operation of the present invention.

As is clearly understood from FIG. 1(a), the sample point at the M-th data of the input digital television signal is coincident with the sample point at the N-th data of the output digital television signal. Hereinafter, the case of $M=3$ and $N=5$, i.e., $f_A:f_B=3:5$ will be described for one example. In FIG. 1(a), the input data train is sequentially expressed as $I_0, I_1, I_2, I'_0, I'_2, \ldots$ and the coverted output data train is sequentially expressed as $O_0, O_1, O_2, O_3, O_4, O'_0, O'_1, O'_2, O'_3, O''_0, \ldots$ respectively. The output data $O_0$ is produced from the input data $I_0$ and $I_1$ by linear interpolation. Similarly, the output datum $O_1$ and $O_2$ are produced by linear interpolation of the output datum $I_0$ and $I_1$, and $I_1$ and $I_2$, respectively. Here, with respect to the output datum $O_0$ and $O_1$, while the same sampling points corresponding to the input datum $I_0$ and $I_1$ are used for the interpolation, the interpolation coefficients thereof are different. This relation also holds true for the output datum $O_2$ and $O_3$, and it is repeated for every five output datum.

Figure 2:
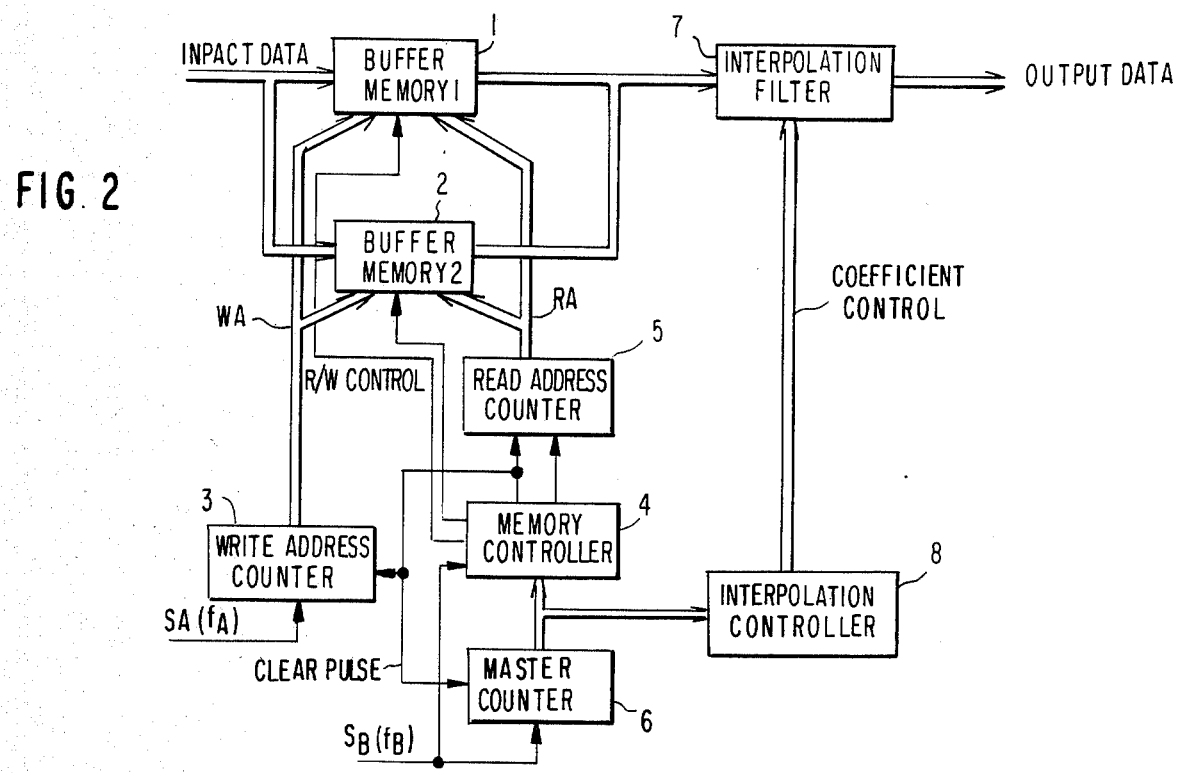
FIG. 2 shows a first embodiment of the present invention.

FIG. 2 shows a first embodiment of the present invention. The input datum of the input digital television signal are applied to buffer memories 1 and 2 juxtaposed with respect to each other. The input datum are alternately stored in the memories 1 and 2 in accordance with a write-address produced by a write-address counter 3. The stored datum in buffer memories 1 and 2 are alternately read out in accordance with a read-address produced by a read-address counter 5. When either one of the buffer memories 1 and 2 is in the write mode, the other is in the read mode. Furthermore, the write and read modes of the memories 1 and 2 are interchanged at every M input data of the input datum. For example, after a first M datum of the input data are stored in the memory 1, next M input datum are stored in the memory 2. The write-address is produced in the write-in address counter 3 by counting the sampling pulses $S_A$ having a frequency $f_A$ (period $T_A$) which corresponds to the sampling rate of the input digital signal. The write-in address counter 3 is cleared every M counts under the control of a clear pulse.

A master counter 6 counts the second sampling pulses $S_B$ (period $T_B$), the counter being cleared by the aforementioned clear pulse. The output of the master counter 6 is applied to a memory controller 4. The memory controller 4 is composed of a decoder 41, a gate 42 and a flip-flop 43 as shown in FIG. 2(a). The decoder 41 produces N timing pulses during N periods of the second sampling pulses $S_B$. The last timing pulse delivered from the decoder 41 is supplied to the flip-flop 43 as the clear pulse. The Q and $\overline{Q}$ outputs of the flip-flop 43 are supplied to the memories 1 and 2 as a write/read control signal, respectively. The gate 42 inhibits two clocks of the second sampling pulses $S_B$ during N periods, i.e., the one clear pulse period.

The read-address counter 5 counts the clocks delivered from the gate 42 and is cleared by the clear pulse. The read-address from the counter 5 is applied to the memories 1 and 2. One period of the clear pulse contains M clocks of the frequency $f_A$ and N clocks of the frequency $f_B$. The sampling period of the read datum alternately derived from the memories 1 and 2 is converted from $T_A$ to $T_B$. The read data are supplied to an interpolation filter 7, where the data at the sampling points are processed for interpolation. The interpolation coefficient of the interpolation filter 7 is controlled by an interpolation controller 8 in synchronism with the clocks of the frequency $f_B$. The interpolation controller 8 receives the output of the master counter 6.

Figure 1B:
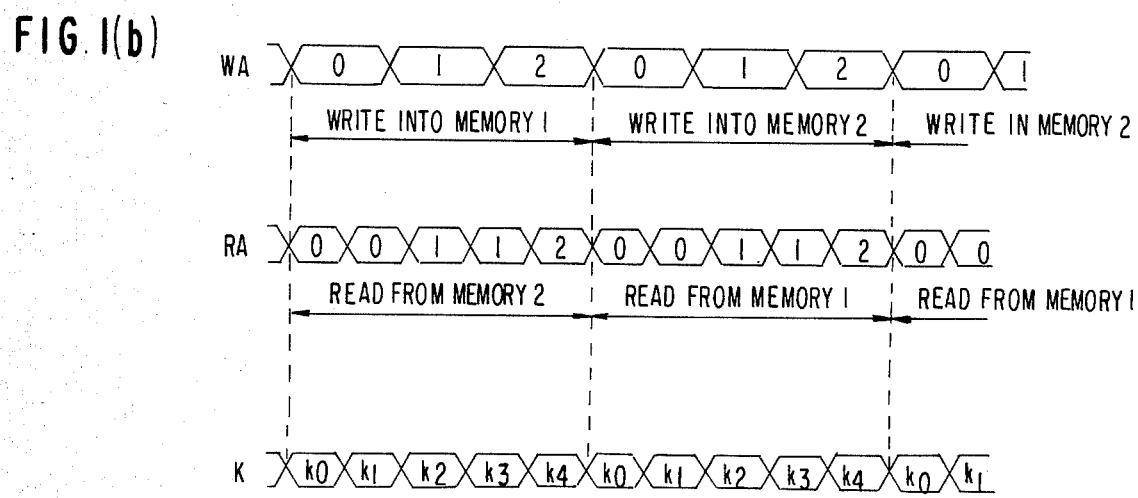
FIG. 1(b) is a diagram showing the operation of the embodiment of the present invention.

FIG. 1(b) is a diagram showing the relationship between both the write and read-addresses supplied to the buffer memories 1 and 2 and the coefficients of the interpolation filter 7. Here, the write-address WA repeats 0, 1, 2, 0, 1, 2 . . . The first three data are written into the buffer memory 1 and the next three data are written into the buffer memory 2. In contrast, the read-address RA has five addresses corresponding to the three write-addresses and the designated addresses are 0, 0, 1, 1 and 2 which are likewise repeated. The flow of the read-address is controlled by the gate 42 in the memory controller 4. The memories are arranged so that when the write-operation is completed the memory 1, the read-operation is simultaneously completed at the buffer memory 2. A transversal filter is generally used as the interpolation filter 7. If the coefficients $k_0$–$k_4$ of the interpolation filter are to be multiplied to each delay output, the control output K of the interpolation controller 8 (FIG. 2) produces a repeating output $k_0$–$k_4$ as shown in FIG. 1(b). In the embodiment shown in FIG. 2, the memory controller 4 and the read-address counter can be substituted by a read-only memory (ROM) which stores the flow of the read-addresses 0, 0, 1, 1 and 2.

When the sampling frequency conversion is effected between two different sampling frequencies in accordance with the present invention, the memory controller 4 and the coefficients of the interpolatrion filter 7 are changed accordingly. These components can be constructed by use of a programmable ROM (P-ROM) so as to change the content of the stored program in accordance with the change in the sampling frequencies. Further, if the buffer memories have sufficient capacity, the same ROM can cope with the change of the sampling frequencies.

Next, the conversion between sampling frequencies in a NTSC TV system will be described by way of example. Here, conversion will be considered between a sampling frequency of 13.31818 MHz i.e., the four times subcarrier frequency which has been widely used in the art and a sampling frequency of 13.5 MHz (which is scheduled to be the world-wide standard sampling frequency used in future digital television signal processing techniques). In this case, $f_A = 13.5$ MHz, $f_B = 14.31818$ MHz and $T_A:T_B = N:M = 33:35$. In FIG. 2, the buffer memories 1 and 2 in this case must have the capacity to store 33 data of the input digital television signals. A higher order interpolation filter is used as the interpolation filter 7 in order to satisfy the gain and phase characteristics within a necessary frequency band. For ease of explanation, linear interpolation using two adjacent sampling points such as shown in FIG. 3 will be considered. The coefficients $k_0, k_1, \ldots, k_n, \ldots k_{34}$ produced from the interpolation controller 8 are as shown in FIG. 4. Specifically, in the sampling frequency conversion from 13.5 MHz to 14.31818 MHz, 35 pairs of coefficients $\alpha$ and $\beta$ are produced. Since it is obvious that the alignment of the coefficients is symmetric with the center of $k_{17}$ and $k_{18}$, the number of coefficients stored in the interpolation controller 8 can be reduced accordingly. On the other hand, in the sampling frequency conversion from 14.31817 MHz to 13.5 MHz, M:N=35:33, the number of coefficients becomes 33 of $k_0$ to $k_{32}$ as also shown in FIG. 4.

Referring to FIG. 5, a second embodiment of the invention contains two buffer memories 13 and 14. The second embodiment of the invention is different from the first embodiment of the invention as shown in FIG. 2, in that the alternating interchange operation of the memories 13 and 14 is performed by switches 15, 16, 17 and 18, and a write-address and a read-address are produced by the combination of registers 19 and 21 and adders 20 and 22. The second embodiment of the invention as shown in FIG. 5, will be explained with reference to the conversion from a; the sampling frequency of 13.5 MHz to a sampling frequency 14.31818 Hz. A master counter 23 counts clocks of the frequency 14.31818 and supplies a count output to a decoder 24 and an interpolation controller 25. The decoder 24 produces a clear pulse which is derived in a manner similar to that the clear pulse derived from the memory controller 4 shown in FIG. 2. The clear pulse from decoder 24 clears registers 19 and 21 as well as the master counter 23. The write-address is produced by the combination of the register 19 and the adder 20. This combination increases the output of the register 19 by "1" in synchronism with the clocks A (13.5 MHz) and the output is supplied to the memory 13 or 14 as the write-address. On the other hand, the combination of register 21 and adder 22 increases the output of the register 21 by "33"/35 in synchronism with the clocks B (14.41818 MHz). The integer portion of the output of the register 21 is applied to the memory 13 or 14 as the read-address. The read datum from the memory 13 or 14 are supplied to a transversal filter 26 where the datum are processed for interpolation.

In the second embodiment, although the second embodiment of the invention has been explained with reference to a sampling frequency conversion from a lower frequency to a higher frequency, it is obvious that a conversion in a reverse manner can be achieved by the same circuit merely by changing the preset value.

Though the foregoing descriptions were made with reference to a sampling frequency conversion for an NTSC TV system, sampling conversion for a PAL system or other such systems can be similarly made according to the present invention.

As described in detail in the foregoing, the present invention provides a sampling frequency converting apparatus which does not need calculation elements having high speed, and yet is extremely simple in construction.

What is claimed is:

1. A sampling frequency converting apparatus for converting an input signal sampled by a first sampling signal at a first frequency $f_A$ into an output digital signal sampled by a second sampling signal at second frequency $f_B$, the relationship between $f_A$ and $f_B$ being $f_A/f_B = M/N$ (M, N: integer), said apparatus comprising:

first and second memory means;

means responsive to a first signal at said first frequency $f_A$ for producing a write-address by incrementing an initial value of said address by one M times to store M datum of said input data signal in said first memory means, said value of said write-address means being cleared after said M increments by a clearing signal, said write-address means switching to store a subsequent M datum of said input data signal in said second memory means;

means responsive to a second signal at said second frequency $f_B$ for producing a read-address by incrementing an initial value of said address by one N times to read the said M datum of said stored digital signal from said second memory means, said value of said read-address means being cleared after said N increments by said clearing signal, said read-address means switching to read a subsequent M datum of said input data signal from said first memory means; and means for interpolating the data signal read from said first and second memory means, said interpolating means having N interpolation coefficients.

2. A sampling frequency converting apparatus for converting an input digital signal sampled by a first sampling signal at a first frequency $f_A$ into an output digital signal sampled by a second sampling signal at a second frequency $f_B$, the relationship between $f_A$ and $f_B$ being $f_A/f_B = M/N$ (M, N: integer), said apparatus comprising:

first and second memory means;

a write-mode memory address counter;

a read-mode memory address counter;

said write-mode counter receiving a first pulse signal at said first frequency $f_A$ as a count input;

a master counter receiving a second pulse signal at said second frequency $f_B$, and producing a master count output;

a memory controller receiving said master count output as a count input, said memory controller producing a clearing pulse, a switching signal and a controller count output as a function of both said count input and said second pulse signal;

said read-mode counter receiving said controller count output as a count input;

said read-mode and write-mode counters being incremented by said respective count inputs and cleared by said clearing pulse from said memory controller;

said first and second memory means receiving said memory address counts of said write-mode and read-mode counters to store and output portions of said input digital signal, respectively;

said first and second memory means, upon receiving said switching signal from said memory controller, switching to receive said memory counts of said read-mode and write-mode counters to output and store portions of said input digital signal, respectively;

an interpolation filter for interpolating said outputted portions of said input digital signal; and an interpolation controller receiving said master count output as a count input, said interpolation controller storing a plurality of interppolation coefficients, said coefficients being inputted to said interpolation filter as a function of said count input.

3. The sampling frequency converting apparatus as recited in claim 2, wherein said memory controller comprises a decoder for decoding said count input from said master controller, a logic gate receiving both an output from said decoder and said second pulse signal and producing said controller count output, and a flip-flop receiving a clear output from said decoder to produce said switching signal, said clear output of said decoder producing said clearing pulse.

* * * * *

UNITED STATES PATENT AND TRADEMARK OFFICE
CERTIFICATE OF CORRECTION

PATENT NO. : 4,630,034

DATED : December 16, 1986

INVENTOR(S) : Hiroshi TAKAHASHI

It is certified that error appears in the above-identified patent and that said Letters Patent is hereby corrected as shown below:

Column 1, line 16, change "ncessary" to read --necessary--;

Column 1, line 18, after "another" insert --sampling--;

Column 2, line 24, after "$I'_0$," insert --$I'_1$,--;

Column 2, line 50, after "input" delete "data" and insert --datum--;

Column 2, line 51, after "memory 1," insert --the--;

Column 3, line 11, after "read" delete "data" and insert --datum--;

Column 3, line 30, before "memory" insert --buffer--;

Column 3, line 39, after "counter" insert --5--;

Column 3, line 45, delete "interpolatrion" and insert --interpolation--;

Column 3, line 56, delete "13.31818" and insert --14.31818--;

UNITED STATES PATENT AND TRADEMARK OFFICE
CERTIFICATE OF CORRECTION

PATENT NO. : 4,630,034

DATED : December 16, 1986

INVENTOR(S) : Hiroshi TAKAHASHI

It is certified that error appears in the above-identified patent and that said Letters Patent is hereby corrected as shown below:

Column 4, line 65, after "input" insert --digital.

Signed and Sealed this

Twenty-second Day of September, 1987

Attest:

DONALD J. QUIGG

*Attesting Officer*    *Commissioner of Patents and Trademarks*